United States Patent
Poulton et al.

(10) Patent No.: US 7,375,667 B2
(45) Date of Patent: May 20, 2008

(54) DISCRETE SYNTHESIS USING STAGGERED NYQUIST REGIONS AVOIDS GUARD BAND INDUCED HOLES NEAR A NYQUIST LIMIT

(75) Inventors: Kenneth D. Poulton, Palo Alto, CA (US); Stephen T Sparks, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/533,153

(22) Filed: Sep. 19, 2006

(65) Prior Publication Data

US 2008/0068244 A1    Mar. 20, 2008

(51) Int. Cl.
*H03M 1/66* (2006.01)
(52) U.S. Cl. ............................ 341/144; 341/126
(58) Field of Classification Search .......... 341/144, 341/140
See application file for complete search history.

(56) References Cited

U.S. PATENT DOCUMENTS

| 6,252,464 | B1 * | 6/2001 | Richards et al. ............... 331/4 |
| 6,429,797 | B1 * | 8/2002 | Wu ........................... 341/143 |
| 6,456,218 | B1 * | 9/2002 | Dedic et al. ................ 341/144 |
| 6,724,832 | B1 * | 4/2004 | Hershberger ................ 375/301 |

\* cited by examiner

*Primary Examiner*—Lam T. Mai

(57) ABSTRACT

Staggered consecutive Nyquist regions associated with differing DAC synthesizer clock rates ($F_{CLK}$) avoids spectrum lost through disjoint guard bands at the end of or between adjacent Nyquist regions. The staggered consecutive Nyquist regions overlap by an amount at least as much as is consumed by the guard bands. Selectable reconstruction filters associated with each Nyquist region and its DAC clock rate are used to enforce the staggered Nyquist regions and their various guard bands.

21 Claims, 3 Drawing Sheets

DISCRETE SYNTHESIS USING STAGGERED NYQUIST REGIONS AVOIDS GUARD BAND INDUCED HOLES NEAR A NYQUIST LIMIT

INTRODUCTION AND BACKGROUND

The application of digital techniques to the creation of waveforms has allowed the development of equipment able to produce, with precision, a wide variety of waveforms that are difficult to produce with purely analog techniques. It is now routine for a 'function generator' to create, whether as single cycles or continuously, all manner of waveforms, such as sine, triangle, sawtooth and square wave, as well as instances of waveforms with an arbitrarily defined shape. Furthermore, whatever can be generated as a 'regular and periodic' waveform can also be the object of a swept format, where over some period of time whatever 'rates of change' might describe the waveform (periods or frequency, rise times) appear to vary in some controlled fashion. For example, the frequency of a sine wave might vary uniformly from $F_0-\Delta$ to $F_0+\Delta$ many times a second while an operator views a display of, say, the frequency response of some network. During this operation the operator may wish to vary the value of either of $\Delta$ or $F_0$; in such a case the 'sweep' (variation of F by $\Delta$) might best be linear with time. In another case the urge may be to sweep from $F_1$ to $F_2$, while still another it might be desirable if the change in F were logarithmic with time. Today's operators of function generators are accustomed to configuring all manner of such parameters (including triggering, phase control, etc.) merely by pressing a few controls on the front panel. Such flexibility (not to mention the issue of genuine precision) cannot be obtained in equipment produced for commercial use that employs purely analog techniques.

One of the most widely used digital techniques for the creation of waveforms is to have at hand a digitized version of the desired waveform and apply it to a DAC (Digital to Analog Converter). In principle, one could use computational resources to compute the digital values as they are needed, in real time at the rate they are needed. In other cases, pre-computed values (e.g., a generic sine, generic sawtooth, etc.) are stored ahead of time in a memory and merely accessed at the rate needed. In another setting, some existing analog signal of interest might first be digitized, perhaps operated upon, and the resulting sequence of digital values applied to the DAC.

There are a number of other digital synthesis techniques that might be used in function generators and for the generation of waveforms in other, non-test equipment, settings. But the one just mentioned is of particular interest, so we will dwell on it for a bit.

As a point of departure, let us imagine a fictitious simple case where a sine wave is to be generated for the first time ever, while using this technique. And while we might wish for anything we want, our labors are within the framework of some enterprise that has placed its own valuation upon the consumption of resources. We approach the powers that be and inquire about what 'clearly' ought to be (at least, so we think at present) the most important element of this synthesis scheme: "Say, Boss, what about the DAC we are supposed to use . . . ." We are told to keep costs under control, try eight or ten bits with good to excellent linearity, BUT, using production parts only (and NO selection of the best parts out of large lots, etc.). We shall assume that speed of operation is not a determinative issue by itself, and that if it costs more to use a fast DAC when fast is necessary, well then, that is just the way it is, and is understood and acceptable to our boss. To this point no one has provoked us with any rude questions about a filter, and we naively proceed without having considered any such issue.

It is clear that if we use, say, ten bit parts, the amplitude axis will be divided into $2^{10}$, or one thousand twenty-four, full scale values. With an eye on the time axis, we also enquire about memory resources. It is suggested that what works for resolution in one axis should be an adequate minimum for another. So we compute one thousand twenty-four consecutive evenly spaced values for the sin(x) over one period, and put them into a table.

Some obvious issues emerge. The frequency of the resulting sine wave will depend upon how often we apply the next value to the DAC. So, if we run through all thousand twenty-four input values in one microsecond the output of the DAC for that microsecond will represent one cycle of a one megahertz sine wave. Clearly, we can create as much or as little of the 'template' stored in memory as desired: We can create any desired fraction of a single cycle, a single cycle that starts and stops at any desired location on the waveform, and continuous trains of consecutive cycles, all by proper sequencing of the addresses applied to the memory containing the template. To create a five megahertz sine wave we would speed things up by a factor of five. We need a way to scale the output, so as to be able to produce different amplitudes. We are suspicious of scaling the values before they are applied to the DAC, as this appears to waste available resolution. But control of the power supplies to the DAC, and variable gain amplification or variable attenuation of the DAC's output, are all fair game in this department, and it appears that they work just fine.

Some other issues arise, too. We give a prototype of our one megahertz sine wave generator to a friend in the next cube who also happens to have a state of the art spectrum analyzer. Half an hour later we hear her exclaim: "WOW! There's a huge family of harmonics in this thing right out to the microwave region, and some are only about fifteen dB down . . . did you guys do that on purpose?"

"Well, . . . no. We didn't."

Despite the fact that it is not easily seen on an oscilloscope, it does not take long to discover the source of the trouble: our DAC is creating a stair-step approximation of a sine wave, and even though they are small (¹⁄₁₀₂₄ of full scale) the transitions are, in keeping with what is expected of a high quality DAC, very abrupt. Those sharp edges represent, or contain, high frequency components that are not properly part of our one megahertz signal. Clearly, we need to condition the output of the DAC with a suitable low pass filter. Much to our relief, a low pass filter does indeed clean up the output.

In fact, it would appear that, properly chosen, the filter does more than just get rid of pesky harmonics: a low pass filter is a transformative mechanism that progressively discriminates against frequency components according to the amount they exceed some cut-off frequency $F_c$. Let us suppose we are generating a pure sine wave at $F_1$, and choose $F_c$ to be a little above $F_1$. The removal of those frequency components above $F_1$ smoothes the output of the DAC, and in so doing provides an interpolation in real time of what would otherwise appear as the point-to-point 'corners' on the edge of the staircase. The unfiltered staircase shaped waveform laden with harmonics now becomes instead a sequence of smoothly connected ramp-like segments. For sine waves, measurable distortion can actually become quite low. Further inquiry and analysis leads us to appreciate that, for sine wave generation, we can indeed rely on the filter to a fairly large extent, and relax the numberof-bits/DAC-resolution. And for essentially the same reasons, we can also reduce the number of points along the waveform that are stored in memory. (We are now, however, informed by Nyquist and Fourier, and appreciate that such relaxations pertain only for frequencies at or above the highest frequency considered in a complex waveform's decomposition. And, we also remain mindful that modulated sine waves are indeed 'complex' and not 'pure' sine waveforms.) For these and other reasons, this form of waveform synthesis has since become quite popular, provided proper attention is paid to this notion of the highest frequency of interest in a complex waveform's decomposition.

Indeed, there are other applications besides test equipment-style 'function generation' where this architecture might be used to create waveforms. Say, for example as a modulator in a radio frequency communications system, such as may be found in cellular telephones. Cellular telephony, and various other classes of radio communication service, have long since abandoned simple AM (Amplitude Modulation) in favor of various other forms of modulation that are more complex, and that are also more suited to the digital representation of content. For example, one generalized form of modulation involves discrete variations in both the amplitude and phase of a carrier signal. There are various modulation components that accept a digital input and a carrier, and produce an amplitude or phase alteration of the carrier according to the applied digital input. As one example, a proper combination of these things will produce π/4 DPSK (pronounced "pi over four differential phase shift keying"). There are other flavors of complex modulation, and we needn't get too concerned about their details, although it is useful to appreciate the notion of out of band 'splatter.' (Splatter is the spurious generation/radiation of power at frequencies out of the band in use, and which rudely appears as extra noise within some other band.) To prevent splatter it is often necessary to limit the rate—by filtering—at which individual amplitude and phase changes are allowed to manifest themselves in the carrier. What we can say is this: whatever style of modulation is in use (including the notion of limiting rates of change for modulation), the final modulated carrier is ultimately just a continuous waveform, and one whose individual cycles are 'essentially' sinusoidal, at that (that is, as individual cycles they outwardly resemble a true sinusoid, but in actual fact, they are complex to the extent they exhibit the effects of some form of modulation). That means that if we could digitally represent those individual cycles of the modulated carrier, we could synthesize that carrier, just as we did one or more cycles of our one megahertz sine wave. So, for example, we imagine an ADC (Analog to Digital Converter) that continuously digitizes applied speech, or perhaps an imaging system that converts an applied image to a formatted digital representation (as with a digital camera), and we apply a continuous (for perhaps a long while) sequence of such digitized information to a "modulation daemon" whose task is, by computational means or by other algorithmic methods, to trade the incoming digitized program material for a digitized cycle by cycle representation of what a modulated IF (Intermediate Frequency) "carrier" should be (and already including any honoring of anti-splatter filtering). We then apply this to a suitably fast DAC whose output is low pass filtered and then supplied to some using environment. For example, we might then mix the IF up to some final RF frequency carrier and then amplify it.

As desirable as this waveform generation architecture is, it is not without its difficulties. Let's say we have a DAC whose clock frequency is $F_s$: that is, the DAC can accept a new digital input value (we might call it a 'sample' occurring at a 'sampling frequency' $F_s$) and produce a new output value once every $1/F_s$ seconds. This DAC can be used to generate a signal $F_{out}$ whose frequency content can range from DC to $(F_s/2)-F_g$ (within the First Nyquist region) or from $(F_s/2)+F_g$ to $F_s-F_g$ (within the Second Nyquist region). (Ideal) Nyquist regions are the consecutive $F_s/2$ intervals along the frequency axis. We have shown above a practical width of these Nyquist regions. Each has been reduced by $F_g$, where $F_g$ is the width of a guard band that is needed because practical filters have skirts that are not vertical, as would be the case with a so-called (and essentially unrealizable) 'brick wall' filter. The following three paragraphs address this need for a guard band.

It will be appreciated that this method of 'constructing' a signal has elements of sampling, and that one method of mixing (heterodyning) two signals is to sample one at the rate of the other. We are not surprised, therefore, to discover (as will be illustrated in connection with FIG. 1) that while generating $F_{out}$ an image $F_s-F_{out}$ appears within the Second Nyquist region. When $F_{out}$ begins to approach $F_s/2$ from below the image $F_s-F_{out}$ will also approach $F_s/2$ from above: $F_{out}$ and its image approach each other with $F_s/2$ as the midpoint of their difference. The image will be severely attenuated or removed by the low pass filter when $F_{out}$ is well below $F_s/2$ (beneath the guard band). However, when it falls within the guard band (somewhere on the skirt of that filter), then there is a fight between the strength of the image and the efficacy of the filter, and the presence of the image is felt. Not only that, but a practical filter 'strong enough' to suppress an image just above $F_s/2$ will also proceed to partially attenuate the associated $F_{out}$ just below $F_s/2$, which is rather inconvenient, to say the least.

The general term describing the presence of unwanted images is "aliasing," and in applications where a waveform is sampled to produce digital values (as in a Digital Sampling Oscilloscope) a filter used to suppress them is known as an 'anti-aliasing' filter. In the particular case we are interested in here (going from the digital samples to an analog waveform with a DAC) the corresponding filter is called a 'reconstruction filter.' In the case of waveform synthesis with a DAC the reconstruction filter removes the staircase transitions in the time domain, as well as the image in the frequency domain. This situation (the appearance of the in-band image when $F_{out}$ is near $F_s/2$) is not unknown, and the usual solution for implementing the guard band is to not allow $F_{out}$ to approach the filter's cutoff value by the width of the guard band. Say, for example, an upper limit for an $F_{out}$ within the First Nyquist region might be set at about 70% or 80% of $F_s/2$.

Similar remarks pertain to the generation of signals within a Nyquist region above the First: there will be a guard band at each end, and the usable portion of the region is reduced by those guard bands.

It appears, then, that we are precluded from generating signals in the 'hole(s)' created by the guard band(s). It is as if the guard bands create a region of inaccessible spectrum.

It seems that our earlier (and fictitious) view that the DAC was essentially all we needed was both naive and incorrect. We will need at least a low pass filter even if we are operating within the First Nyquist region, and appropriate band pass filters for operation in higher Nyquist regions. It seems the filters are essential, since upon reflection we appreciate that, just as the images are there, each of the Nyquist regions 'is there', too, whether we intend to use them, or not! (They exist for essentially reasons similar to those explaining the images, and also stem from heterodyne theory.) Thus it is that we find conventional systems of this sort which achieve multi-region synthesis operation by switching between reconstruction filters, and these filters enforce guard bands. That works, but there is a nasty drawback: the synthesizer cannot generate signals that fall within, or approach too close to, the guard bands. So, even if we had a perfect DAC the frequency range of the system would still be limited by the guard bands in the filters to less than what is between any two consecutive Nyquist limits. We know better than to expect to have the services of a 'perfect' filter to reduce the width of the guard band(s) to 'zero'! We resent having obtained a first rate DAC only to be unable to use it to its full potential because of the need for significant guard bands. We appreciate that multi-region operation is possible through filter switching, and that such operation must be stay within the Nyquist region selected, and cannot span those regions. So be it. But must we suffer the loss of valuable spectrum at the end of a region or between regions (or limit bandwidth accordingly) on account of the 'holes' represented by the guard bands? It seems we need a way to outfox the tyranny of the Nyquist regions without offending Mother Nature. What to do?

SIMPLIFIED DESCRIPTION

A solution to the problem of recovering guard band spectrum at the end of or between Nyquist regions of a DAC, clocked to receive a sequence of digital signals that are samples of a desired output signal to be synthesized, is to stagger consecutive Nyquist regions by varying the frequency $F_{CLK}$ of the clock signal at which the DAC is driven. The staggered consecutive Nyquist regions overlap by an amount at least as much as is consumed by the guard bands. For example, and neglecting guard bands, an initial raw band of operation $RB_1$ may be a First Nyquist region for a basic sampling frequency $F_s$. An adjacent raw band of operation $RB_2$ that overlaps $RB_1$ may be the Second Nyquist region for an alternate sampling frequency $2F_s/3$. An adjacent raw band of operation $RB_3$ that overlaps $RB_2$ may be the Second Nyquist region for the basic sampling frequency $F_s$. These raw bands overlap:

| | | | | |
|---|---|---|---|---|
| $RB_1$: | DC | to | $F_s/2$ | $1^{st}$ Nyq. for $F_{CLK} = F_s$ |
| $RB_2$: | $(2/3)F_s - (1/2)(2/3F_s) = F_s/3$ | to | $2(2F_s/3)/2 = 2F_s/3$ | $2^{nd}$ Nyq. for $F_{CLK} = 2F_s/3$ |
| $RB_3$: | $F_s - (1/2)F_s = F_s/2$ | to | $2(F_s/2) = F_s$ | $2^{nd}$ Nyq. for $F_{CLK} = F_s$ |

In this example the smallest overlap is $F_s/6$. Suppose we then select widths for guard bands $G_i$ that do not exceed half that, or $F_s/12$. Using $G_{B1L}, G_{B1U}, \ldots G_{B3L}, G_{B3U}$ to denote the respective lower and upper widths for the particular instances of the various guard bands in the associated raw bands (and these various $G_i$ may be all the same, or not), we may describe the actual usable bands $B_1$-$B_3$ as:

| | | | | |
|---|---|---|---|---|
| $B_1$: | DC | to | $(1/2)F_s - G_{B1U}$ | $1^{st}$ Nyq. for $F_{CLK} = F_s$ |
| $B_2$: | $(1/3)F_s + G_{B2L}$ | to | $(2/3)F_s - G_{B2U}$ | $2^{nd}$ Nyq. for $F_{CLK} = 2F_s/3$ |
| $B_3$: | $(1/2)F_s + G_{B3L}$ | to | $F_s - G_{B3U}$ | $2^{nd}$ Nyq. for $F_{CLK} = F_s$ |

Note:
$G_{B2U}$ should be read as "(the) guard (band) at (usable) band-#2-upper (end)" and $G_{B3L}$ should be read as "(the) guard (band) at (usable) band-#3-lower (end)".

These actual usable bands $B_1$-$B_3$ will overlap at locations where, and by the extent that, the various $G_i$ are less than or equal to $F_s/12$. If the various $G_i$ are each $F_s/12$ then the usable bands will have pass bands that 'just touch,' and not overlap.

Selectable reconstruction filters associated with each band and its DAC sample rate ($F_{CLK}$ are used to enforce the staggered Nyquist regions and their various guard bands. The different DAC clock rates of $F_{CLK}$ ($F_s$ and $2F_s/3$) may be obtained from two separate sources, from an adjustable source, or from a single source whose output is variably divided. Additional DAC clock rates and reconstruction filters with guard bands may be used to operate in still higher Nyquist regions.

DETAILED DESCRIPTION

Figure 1:
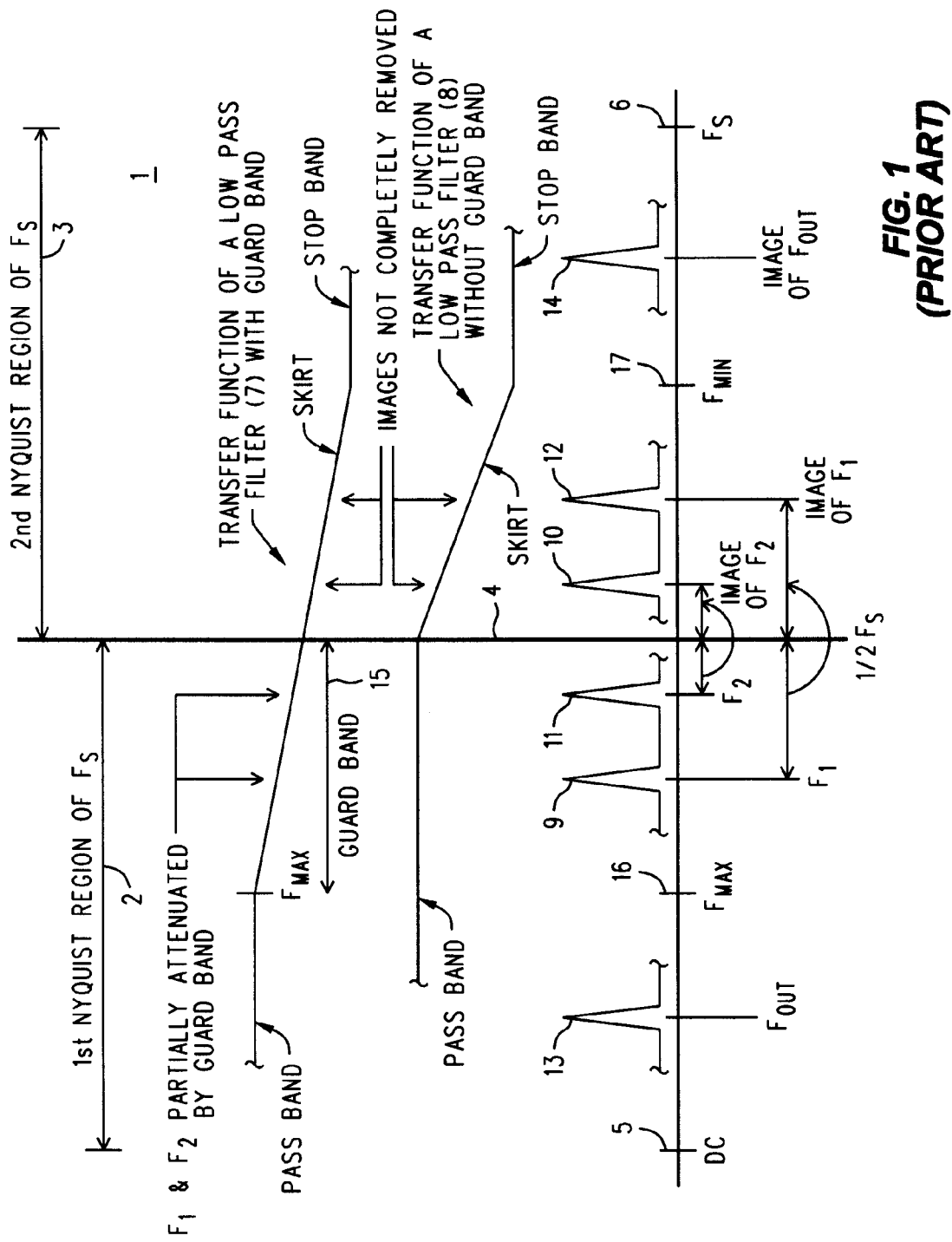
FIG. 1 is a simplified illustration of the presence of, and low pass reconstruction filtering (with and without a guard band) of, images for signals synthesized with a DAC at near $F_s/2$.

Refer now to FIG. 1, wherein is shown a simplified representation 1 of a frequency synthesis regime where digital samples, applied at a DAC clock rate of CLK=$F_s$, are converted back to analog values to produce a synthesized signal that varies in time. As shown in the diagram, the First Nyquist region 2 extends from DC (5) to $F_s/2$ (4), while the Second Nyquist region 3 extends from $F_s/2$ to $F_s$ (6). As is well appreciated by those who are familiar with this sort of thing, signals generated in the First Nyquist region have images in the next higher (Second, Third, etc.) Nyquist region.

So, for example, consider the synthesis of frequencies $F_1$ (9) and $F_2$ (11), both fairly close to the Nyquist limit of $F_s/2$. Each has a corresponding image (12, 10, respectively) in the Second Nyquist region 3. What is typically done to suppress these images (12, 10) is to bandlimit the synthesized signal to something less than $F_s/2$. Such an arrangement is represented by the passband of a low pass filter (7), where minimum attenuation occurs at frequencies $F_{max}$ (16) and below, while maximum attenuation occurs within a stop band of frequencies above $F_{min}$ (17) within the Second Nyquist region 3. While the image 12 of $F_1$ 9 and the image 10 of $F_2$ 11 are completely removed from the Second Nyquist region, $F_1$ and $F_2$ are themselves unfortunately on the slope, or skirt, of the low pass filter (7), and are thus partially attenuated by the pesky guard band 15 created by that filter.

It would seem that we are obliged to live with the guard band 15, for even if we had a filter with steeper skirts and then slid its passband over to be as shown for 8 (a no guard band situation for the First Nyquist region) we can see that, while $F_1$ and $F_2$ are not bothered within the First Nyquist region, their images (12, 10) in the Second Nyquist region are not completely attenuated. We can see that the price that must be paid for image attenuation in the bottom of the Second Nyquist region is a guard band that begins in the top of the First Nyquist region. Accordingly, guard band situations tend to look like the skirt of filter 7 rather than like the skirt of filter 8.

Of course, signals such as $F_{out}$ 13, that are of frequency less than or equal to $F_{max}$, are not attenuated at all within the First Nyquist region, while their images (14) receive maximum attenuation in the Second Nyquist region.

Accordingly, the synthesis regime depicted in FIG. 1 is limited to operation from DC (5) to $F_{max}$ (16), where $F_{max}$ is determined by the width of some guard band 15 extending from $F_{max}$ to $F_s/2$.

And, it will be appreciated that if one were contemplating reconstructing signals in the Second Nyquist region, then a corresponding need occurs for a comparable guard band that goes from $F_s/2$ up to some $F_{min}$ (17). Attempts to generate frequencies between $F_s/2$ and $F_{min}$ will again result in images that not fully attenuated, except that this time those unwanted images will be in the First Nyquist region. Furthermore, the lower end of a filter for such a guard band in the Second Nyquist region would have the property that the midpoint of its skirt was $F_s/2$ (see 7, except the skirt would be going up and to the right), so that even if we attempted multi-band synthesis with switched filters, the region from $F_{max}$ 16 (for the First Nyquist region 2) to $F_{min}$ 17 (in the Second Nyquist region 3) cannot be generated. Now, isn't that disgusting?

Figure 2:
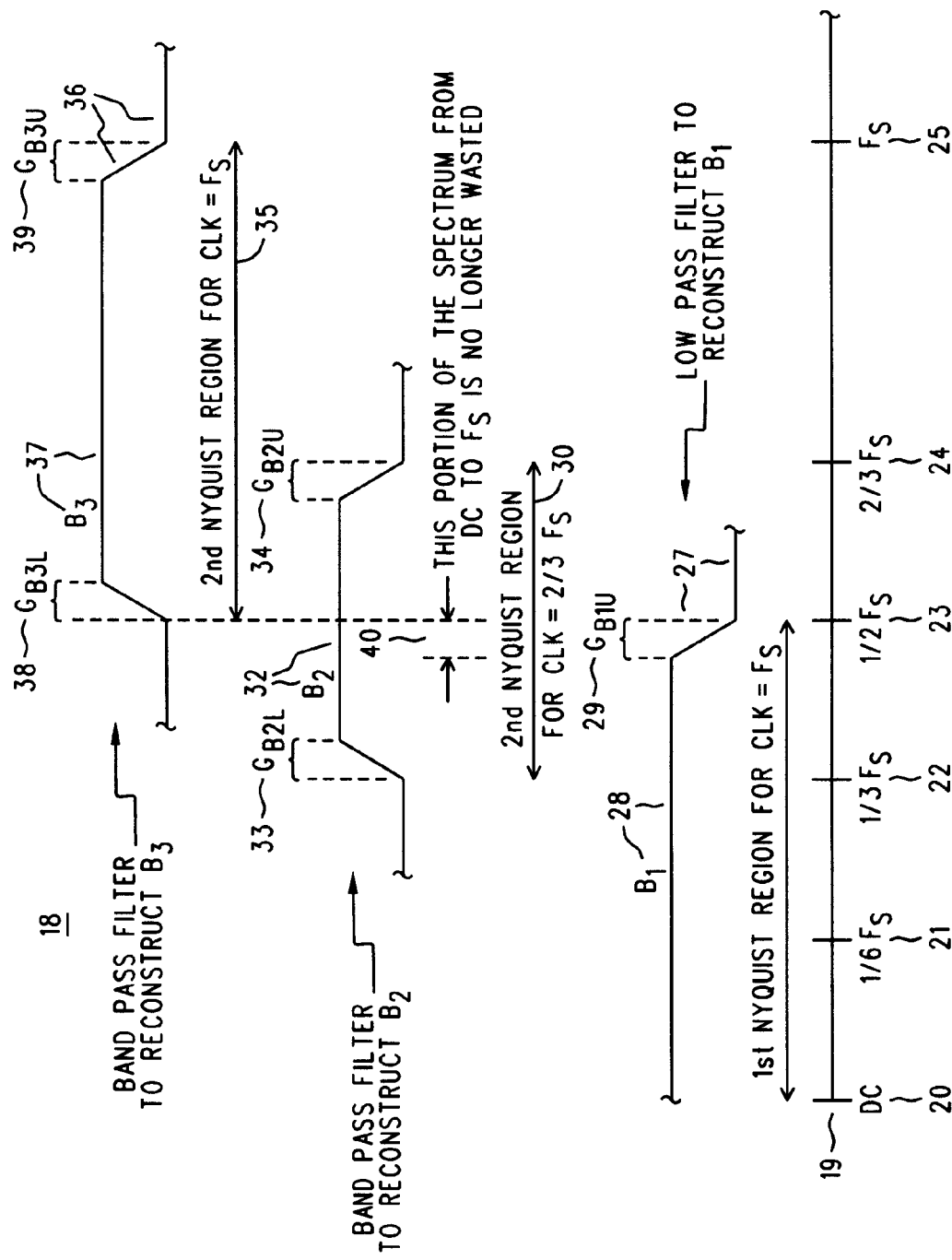
FIG. 2 is a simplified illustration of a frequency synthesis regime using three staggered and overlapping Nyquist regions to avoid wasting the frequencies between two conventional guard bands for consecutive non-staggered Nyquist regions.

Now consider the synthesis regime 18 depicted in FIG. 2. Here we suppose that we are not only prepared to switch reconstruction filters for multi-band synthesis, but that we are also prepared to vary the clock rate $F_{CLK}$ applied to the DAC. We shall describe those DAC clock frequencies as different frequencies for $F_{CLK}$, and then state some relation between them in terms of $F_s$ ('$F_{CLK}=F_s$' and '$F_{CLK}=2F_s/3$'). This is convenient and is consistent with the notation used in FIG. 1. It is also consistent with the desirable practice of starting with one clock rate ($F_s$) and using it to derive the other ($2F_s/3$), rather than have two independent clocks and the attendant mischief that their relative drift might cause. As for our choice of $F_s$ and $2F_s/3$, well, that is just one example among many that will work, and it happens to also be a practical one.

In particular, then, FIG. 2 shows a First Nyquist region 26 for $F_{CLK}=F_s$ that runs along a frequency axis 19 from DC (20) to $(\frac{1}{2})F_s$ (23). Associated with operation in a band $B_1$ (28) that occupies this First Nyquist region 26 for $F_{CLK}=F_s$ is low pass filter whose characteristics (27) correspond to the low pass filter (7) of FIG. 1. Indeed, band $B_1$ corresponds to the situation described in FIG. 1 for a low pass filter (7) and operation between DC and $F_{max}$ (16). In this connection, we note that the skirt (29) of the low pass filter (27) for $B_1$ is a guard band that we call $G_{B1U}$ (think: "Guard on $B_1$-Upper"), and that it becomes fully effective at $(\frac{1}{2})F_s$ (23). Indeed, operation in $B_1$ will be from DC to $(\frac{1}{2})F_s-G_{B1U}$. So, the bottom one third portion of FIG. 2 is very much the same as described in connection with FIG. 1.

Now consider the top one third of FIG. 2. It describes a band $B_3$ (37) in the Second Nyquist region 35 for $F_{CLK}=F_s$. In this case image suppression requires the services of a bandpass filter whose shape (36) includes guard bands $G_{B3L}$ (38) and $G_{B3U}$ (39). It is clear that $B_3$ runs from $(\frac{1}{2})F_s+G_{B3L}$ to $F_s-G_{B3U}$. It abundantly clear that $B_1$ and $B_3$ are worse than disjoint: they are non-adjacent and fail to meet (let alone overlap) by $G_{B1U}+G_{B3L}$. This is the disgusting circumstance (guard band induced holes) noted earlier.

Now consider the central third of FIG. 2. It depicts the Second Nyquist region for $F_{CLK}=(\frac{2}{3})F_s$, as reconstructed by a bandpass filter whose shape is 31 and that produces operation in a band $B_2$ that is centered directly over the 'hole' (40) between $B_1$ and $B_3$, namely: $[(\frac{1}{2})F_s-G_{B1U}$ to $(\frac{1}{2})F_s+G_{B3L}]$. Not only does it 'plug the hole,' as it were, but it does so with room to spare. It achieves this desirable feature because at the low end of $B_2$ the guard band $G_{B2L}$ (33) is neither adjacent nor overlapping with $G_{B1U}$ (29) at the upper end of $B_1$, and $G_{B2L}$ is 'to the left of' $G_{B1U}$ along the frequency axis 19 by some nonzero amount. Similarly, the high end of $B_2$ $G_{B2U}$ (34) is neither adjacent nor overlapping with $G_{B3L}$ (38) at the lower end of $B_3$, and $G_{B2U}$ is 'to the right of' $G_{B3L}$ along the frequency axis 19, also by some nonzero amount.

It is clear in this example that the various Nyquist regions overlap and that their ends are $F_s/6$ apart. For brevity, we shall mean the same thing by saying that bands $B_1$, $B_2$ and $B_3$ are staggered (in this case, by $F_s/6$). If we pick the width of the $G_i$ to be less than $F_s/12$ (or thereabouts) we will achieve the situation described for $B_2$ (how it 'plugs the hole' between $B_1$ and $B_3$). Note that the spectrum represented by the 'hole' 40 is no longer inaccessible. (And to look ahead, what we need now is an economical way to bring such a $B_2$ into being between $B_1$ and $B_3$, so that all three are staggered.)

It will also be clear to those skilled in the art that other examples of staggered bands that plug holes can be produced using different fractional values of $F_s$ as $F_{CLK}$ (e.g., $F_s$ and $4F_s/5$), including the notion of using three (or more) related DAC clock frequencies for $F_{CLK}$ and Third (or higher) Nyquist regions. For example, we could use:

| | | | | |
|---|---|---|---|---|
| $RB_1$: | $F_s/2$ | to | $F_s$ | $2^{nd}$ Nyq. for $F_{CLK}=F_s$ |
| $RB_2$: | $4F_s/5$ | to | $6F_s/5$ | $3^{rd}$ Nyq. for $F_{CLK}=4F_s/5$ |
| $RB_3$: | $F_s$ | to | $3F_s/2$ | $3^{rd}$ Nyq. for $F_{CLK}=F_s$ |
| $RB_4$: | $4F_s/3$ | to | $5F_s/3$ | $5^{th}$ Nyq. for $F_{CLK}=2F_s/3$ |
| $RB_5$: | $3F_s/2$ | to | $2F_s$ | $4^{th}$ Nyq. for $F_{CLK}=F_s$ |

An alternate choice for $RB_4$ would be:

| | | | | |
|---|---|---|---|---|
| $RB_4$: | $9F_s/7$ | to | $12F_s/F$ | $4^{th}$ Nyq. for $F_{CLK}=6F_s/7$ |

This latter choice provides a wider $RB_4$ at the expense of a more complicated task for $F_{CLK}$ generation. In this connection, it will be appreciated that in some cases precise ratios need not be used, although there are many where precision would be desirable.

Figure 3:
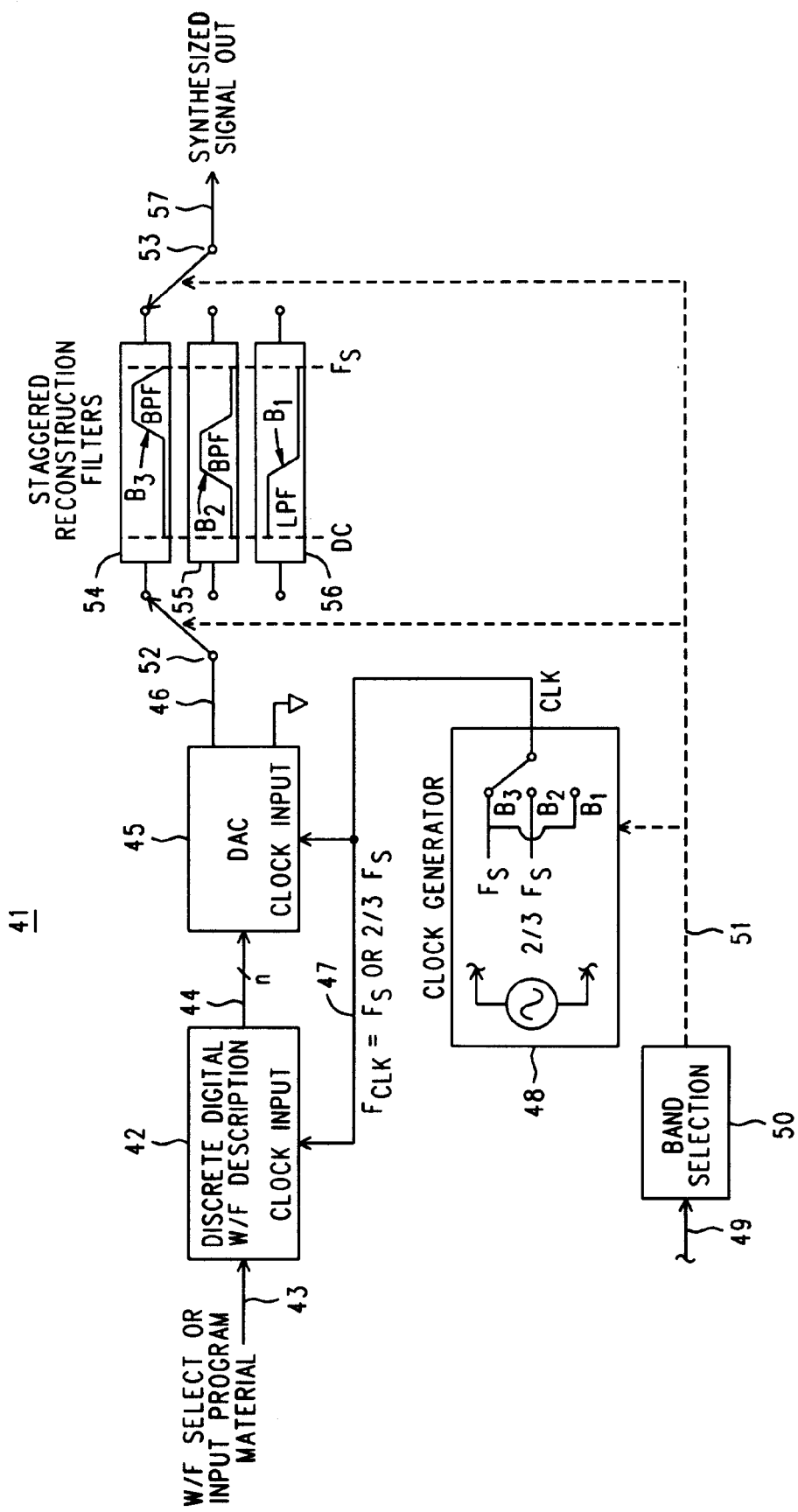
FIG. 3 is a simplified block diagram of a frequency synthesis circuit operating in accordance with the frequency synthesis regime of FIG. 2.

Finally, refer now to FIG. 3. It is a simplified block diagram 41 of a circuit arrangement that will implement the synthesis regime 18 of FIG. 2. At its heart is a DAC 45 that receives its digital input 44 at a selectable rate $F_{CLK}$. Depending upon the nature of the DAC, it may or may not be individually clocked. In the clocked case the DAC latches applied inputs when clocked and adjusts its analog output, while in the other it simply always tracks the applied digital input. Much would depend upon the extent to which the bits of the input transition in unison, and perhaps whether or not the DAC 45 and circuit 42 (described below) are portions of the same integrated circuit. It is a safe bet that for high speed operation, and in the case where the DAC and circuit 42 are separate, the DAC 45 will likely be separately clocked, as shown.

To implement the regime 18 of FIG. 2 $F_{CLK}$ would be $F_s$ for operation in $B_1$ and $B_3$, and (⅔)$F_s$ for operation in $B_2$. A clock signal 47 having the selected frequency $F_{CLK}$ is produced by a suitable Clock Generator 48 responsive to a Band Selection signal 51 that is produced from a Band Selection Circuit 50. Band Selection Circuit 50 is in turn responsive to a suitable control signal 49 produced by some larger environment (not shown) that determines in which band the synthesized signal is to appear.

A sequence of n-bit digital values (44) is applied to DAC 45 at the rate of $F_{CLK}$. These digital values 44 originate from a mechanism (42) whose job it is to turn some input program material (43), which might be some form of data (as for a digital picture) or speech (digitized or not), into the digital sequence 44. We have kept mechanism 42 pretty simple, even though everybody knows it is not. On the other hand, it is a part of an established art dealing with sampling, and regardless of its true internal complexity (it might span different clock domains, for example, or have to deal with disparate resolutions), it will be appreciated that for our present purpose we just need it to do whatever it does, and politely give out a new digital value 44 once every cycle of the clock signal 47 (i.e., once every period of $F_{CLK}$). As an alternative, however, we are also prepared to appreciate that input 43 might be a Waveform Select control signal that has a value that indicates that some particular waveform useful in electrical testing is to be generated (e.g., sine, square, triangle, saw tooth, etc.). In this connection, we should be prepared to expect that circuit 42 might include a memory that contains pre-stored values (i.e., a look-up table), or even computational circuitry that will calculate the digital values 44 in response to some activity at input 43.

Circuit 42 delivers to the DAC 45 a digital data 44 which represents the analog waveform to be generated. Circuit 42 can read pre-calculated waveform data from a memory, or it can numerically compute the waveform data from parameters such as sample rate, output frequency, amplitude, starting phase, etc., or, it can generate waveforms with high output frequencies whose parameters such as amplitude or phase or frequency vary based on input symbols at a much lower bit rate, or it can use a combination of these methods. In all cases, there is a certain signal bandwidth (which might or might not extend down to DC), and Nyquist informs us that we need to sample the waveform at a rate at least twice as fast as that bandwidth in order to accurately represent the signal.

The output samples 46 from the DAC 45 thus represent some signal (44) that is to be reconstructed in one of the Nyquist regions described in connection with the regime 18 of FIG. 2. To that end we need three reconstruction filters: one for each of bands $B_1$, $B_2$ and $B_3$. Those filters are low pass reconstruction filter 56 for $B_1$, bandpass reconstruction filter 55 for $B_2$, and bandpass reconstruction filter 54 for $B_3$. The appropriate one of these reconstruction filters is switched in by coupling mechanism 52 and switch 53 in response to the Band Selection Signal 51. Coupling mechanism 52 might be a 'switch' just as is its counterpart 53 (e.g., coaxial relays or FETs might be used as switches). As an alternative, however, such a coupling mechanism 52 might comprise a combination of a power splitter and buffer amplifiers that allows all three reconstruction filters to be driven all the time. At the output of switch 53 is a synthesized output signal 57. It would likely be further conditioned (e.g., amplification, leveling) and applied to some external environment (e.g., as a local oscillator signal within some piece of electronic test equipment, or after further processing, into the ether via an aerial).

We claim:

1. A method of supplying a synthesized output signal, the method comprising the steps of:
   (a) selecting one of two non-disjoint bands $B_1$ or $B_2$ respectively representing staggered Nyquist regions that are a First Nyquist region for a basic sampling frequency $FS_1$ and a Second Nyquist region for an alternate sampling frequency $FS_2$, where P/Q is some fraction less than one and $FS_2 = (P/Q)(FS_1)$;
   (b) forming a sequence of digital values that represent, with samples at the sampling frequency for the band chosen in step (a), an analog waveform corresponding to the synthesized output signal;
   (c) if $B_1$ is selected, then:
      (c1) applying at sampling frequency $FS_1$ the sequence of digital values of step (b) to a digital input of a digital to analog converter;
      (c2) applying an analog output of the digital to analog converter to a low pass reconstruction filter, of cutoff frequency $FS_1/2$ less a guard band, to produce a synthesized signal in the band $B_1$; and
      (c3) supplying an output of the low pass reconstruction filter of step (c2) as the synthesized output signal; else
   (d) if $B_2$ is selected, then:
      (d1) applying at sampling frequency $FS_2$ the sequence of digital values of step (b) to a digital input of a digital to analog converter;
      (d2) applying an analog output of the digital to analog converter to a bandpass reconstruction filter, of passband $FS_2/2$ plus a guard band to $FS_2$ less a guard band, to produce a synthesized signal in the band $B_2$; and
      (d3) supplying an output of the bandpass reconstruction filter of step (d2) as the synthesized output signal.

2. A method as in claim 1 wherein P/Q=⅔.

3. A method as in claim 1 wherein P/Q=⅘.

4. A method as in claim 1 wherein n is a natural number P/Q is of the form n/(n+1), and wherein n is a natural number.

5. A method as in claim 2 wherein the width of each guard band is less than or equal to $FS_1/12$.

6. A method as in claim 4 wherein the width of each guard band is less than or equal to $FS_1/(4n)$.

7. A method as in claim 1 wherein step (b) further comprises the step of digitizing applied program material representing an analog waveform to obtain the sequence of digital values.

8. A method as in claim 7 wherein the synthesized output signal is a carrier signal modulated according to the applied program material.

9. A method of supplying a synthesized output signal, the method comprising the steps of
   (a) selecting one of three non-disjoint bands $B_1$, $B_2$ or $B_3$ respectively representing staggered Nyquist regions that are a First Nyquist region for a first sampling frequency $FS_1$, a Second Nyquist region for a second sampling frequency $FS_2$ and the Second Nyquist region for the first sampling frequency $FS_1$;

(b) forming a sequence of digital values that represent, with samples at the sampling frequency for the band chosen in step (a), an analog waveform corresponding to the synthesized output signal;

(c) if $B_1$ is selected, then:
  (c1) applying, at the first sampling frequency $FS_1$, the sequence of digital values of step (b) to a digital input of a digital to analog converter;
  (c2) applying an analog output of the digital to analog converter to a low pass reconstruction filter, of cutoff frequency $FS_1/2$ less a guard band, to produce a synthesized signal in the first band $B_1$; and
  (c3) supplying an output of the low pass reconstruction filter of step (c2) as the synthesized output signal; else (d) if $B_2$, is selected, then:
  (d1) applying, at the second sampling frequency $FS_2$, the sequence of digital values of step (b) to a digital input of a digital to analog converter;
  (d2) applying an analog output of the digital to analog converter to a first bandpass reconstruction filter, of passband $FS_2/2$ plus a guard band to $FS_2$ less a guard band, to produce a synthesized signal in the second band $B_2$; and
  (d3) supplying an output of the first bandpass reconstruction filter of step
  (d2) as the synthesized output signal; else (e) if $B_3$, is selected, then:
  (e1) applying, at the first sampling frequency $FS_1$, the sequence of digital values of step (b) to a digital input of a digital to analog converter;
  (e2) applying an analog output of the digital to analog converter to a second bandpass reconstruction filter, of passband $FS_1/2$ plus a guard band to $FS_1$ less a guard band, to produce a synthesized signal in the third band $B_3$; and
  (e3) supplying an output of the second bandpass reconstruction filter of step (e2) as the synthesized output signal.

10. A method sit in claim 9 wherein $FS_2=2FS_1/3$.

11. A method as in claim 10 wherein the width of each guard band is less than or equal to $FS_1/12$.

12. A method as in claim 9 wherein step (b) further comprises the step of digitizing applied program material representing an analog waveform to obtain the sequence of digital values.

13. A method as in claim 12 wherein the synthesized output signal is a carrier signal modulated according to the applied program material.

14. Apparatus for supplying a synthesized output signal, the apparatus comprising:
  a clock signal generator having a band selection input and a sampling clock output at which cycles a sampling clock signal at a selected one of at least two sampling rates having respective frequencies $FS_1$ and $FS_2$ according to a band selection signal applied to the band selection input;
  a first circuit, coupled to the sampling clock signal, that provides at a digital output thereof, and at the selected sampling rate, a sequence of digital values corresponding to equally spaced samples along a waveform template describing a shape of the synthesized output signal;
  a digital to analog converter having a digital input coupled to the digital output of the fast circuit and having an analog output;
  first, second and third reconstruction filters, of overlapping and staggered passbands, each having an input coupled to the analog output of the analog to digital converter, and each having an output at which appears a respective reconstructed output signal;
  a signal selection circuit having an input coupled to the band selection signal and having three signal inputs coupled to each of the outputs of the first, second and third reconstruction filters, and having an output at which appears as the synthesized output signal a selected one of the respective reconstructed output signals;
  a band selection circuit responsive to a control signal indicating a desired frequency band of operation for the synthesized output signal by producing at an output a corresponding band selection signal;
  the first reconstruction filter having a passband within a First Nyquist region of $FS_1$;
  the second reconstruction filter having a passband within a Second Nyquist region of $FS_2$; and
  the third reconstruction filter having a passband within a Second Nyquist region of $FS_1$.

15. Apparatus as in claim 14 wherein $FS_2=(2/3) FS_1$.

16. Apparatus as in claim 15 wherein each of the first, second and third reconstruction filters includes at least one guard band of width less than or equal to $FS_1/12$.

17. A method of supplying a synthesized output signal, the method comprising the steps of:
  (a) selecting one of two bands $B_1$ or $B_2$ respectively representing Nyquist regions that are a $N^{th}$ Nyquist region for a basic sampling frequency $FS_1$ and a $M^{th}$ Nyquist region for an alternate sampling frequency $FS_2$, where P/Q is some fraction less than one and $FS_2=(P/Q)(FS_1)$ and N and M are natural numbers;
  (b) forming a sequence of digital values that represent, with samples at the sampling frequency for the band chosen in step (a), an analog waveform of the synthesized output signal;
  (c) if $B_1$ is selected, then:
    (c1) applying at sampling frequency $FS_1$ the sequence of digital values of step b) to a digital input of a digital to analog converter;
    (c2) applying an analog output of the digital to analog converter to a first reconstruction filter, of passband $(N-1) FS_1/2$ plus a guard band to $NFS_1/2$ less a guard band, to produce a synthesized signal in the band $B_1$; and
    (c3) supplying an output of the first reconstruction filter of step (c2) as the synthesized output signal; else
  (d) if $B_2$ is selected, then:
    (d1) applying at sampling frequency $FS_2$ the sequence of digital values of step (b) to a digital input of a digital to analog converter,
    (d2) applying an analog output of the digital to analog converter to a second reconstruction filter, of passband $(M-1) FS_2/2$ plus a guard band to $MFS_2/2$ less a guard band, to produce a synthesized signal in the band $B_2$; and
    (d3) supplying an output of the second reconstruction filter of step (d2) as the synthesized output signal.

18. A method as in claim 17 wherein N=1, M=2 and P/Q=2/3.

19. A method as in claim 17 wherein P/Q is of the form j/(j+1), and wherein j is a natural number.

20. A method as in claim 19 wherein the width of each guard band is less than or equal to $FS_1/(4j)$.

21. A method of synthesizing a band-limited output signal $S_{out}$ in a band B with a continuous range of frequencies for $S_{out}$ larger than half the maximum sample rate, the method comprising the steps of:

(a) selecting a sample rate $F_s$ from a set of at least two sample rates;

(b) selecting a Nyquist region of the sample rate $F_s$ selected in step (a) such that the band B is contained within the selected Nyquist region of $F_s$ and no integer multiple of $F_s/2$ is included in B;

(c) forming a sequence of digital values that represent samples of desired program material at the sample rate $F_s$;

(d) applying the sequence of digital values to a digital to analog converter operating at the sample rate $F_s$;

(e) selecting a reconstruction filter that will pass the band B while strongly attenuating signals that fall outside the selected Nyquist region and inside other possible Nyquist regions; and (f) filtering an output of the digital to analog converter with the selected reconstruction filter.

* * * * *

UNITED STATES PATENT AND TRADEMARK OFFICE
CERTIFICATE OF CORRECTION

PATENT NO. : 7,375,667 B2  Page 1 of 1
APPLICATION NO. : 11/533153
DATED : May 20, 2008
INVENTOR(S) : Poulton et al.

It is certified that error appears in the above-identified patent and that said Letters Patent is hereby corrected as shown below:

In column 11, line 43, in Claim 10, delete "sit" and insert -- as --, therefor.

Signed and Sealed this

Ninth Day of September, 2008

JON W. DUDAS
*Director of the United States Patent and Trademark Office*